United States Patent [19]

Sinh

[11] Patent Number: 5,220,212

[45] Date of Patent: Jun. 15, 1993

[54] SINGLE LEVEL BIPOLAR ECL FLIP FLOP

[75] Inventor: Nguyen X. Sinh, San Jose, Calif.

[73] Assignee: National Semiconductor Corp., Santa Clara, Calif.

[21] Appl. No.: 775,796

[22] Filed: Oct. 10, 1991

[51] Int. Cl.[5] .................... H03K 19/20; H03K 3/289
[52] U.S. Cl. .................... 307/455; 307/480; 307/272.2
[58] Field of Search ............ 307/455, 480, 272.1, 307/272.2

[56] References Cited

U.S. PATENT DOCUMENTS

| 4,675,553 | 6/1987 | Price et al. ............ 307/272.2 |
| 4,841,168 | 6/1989 | Kubota ................... 307/272.2 |
| 4,970,417 | 11/1990 | Kubota ................. 307/455 |

Primary Examiner—Edward P. Westin
Assistant Examiner—Andrew Sanders
Attorney, Agent, or Firm—Steven F. Caserza

[57] ABSTRACT

An ECL OR gate circuit, or a logical equivalent AND gate circuit, is provided whereby the input signals are both referenced to the same bias reference signal such that the propagation delay between each input port to the output port of the gate is substantially equivalent. Also provided is an improved ECL flip flop circuit using the ECL OR (or AND) circuit taught in accordance with the teachings of this invention for a faster ECL flip flop. In accordance with the teachings of this invention, a flip flop clock input signal is referenced to the same bias reference signal as the flip flop data input signal such that the propagation delay between the clock input to the output stage is substantially the same as the data input to the output stage.

8 Claims, 6 Drawing Sheets

SINGLE LEVEL BIPOLAR ECL FLIP FLOP

TECHNICAL FIELD

This invention pertains to emitter-coupled logic (ECL) circuits, and more particularly to an ECL flip flop circuit.

BACKGROUND

Flip flops are well known in the art, as are emitter coupled logic (ECL) circuits in general. ECL circuits are often preferred due to the very high speeds achieved. ECL circuits have found particular use in telecommunications applications where increasing bit rates require increased speed of operation of logical circuits.

ECL fabrication processes are continually being upgraded in order to provide increased speed. It is also desirable to increase the speed of operation of the circuitry itself, for example to increase the toggling frequency of a D flip flop 100 shown in FIG. 1. The toggle rate, $f_{toggle}$, is the inverse of the sum of the setup time for data input $D_M$ 102 and the propagation delay for clock input CLK 101 to reach output Q 103, $$f_{toggle} = \frac{1}{t_{setup\ data} + t_{pd\ clock\ to\ Q}} \quad (1)$$

FIG. 2 is a prior art logic diagram of the typical D flip flop 100 of FIG. 1, including input port 102 for input data $D_M$ and input port 101 for input clock signal CLK. Flip flop 100 also includes output port 103 and 104 for providing output signals Q and $\overline{Q}$, respectively, in response to input signals $D_M$ and CLK. The logic diagram in FIG. 2, shows that flip flop 100 may be constructed of a combination of NAND logic gates or OR logic gates, such as OR gate 10 or NAND gate 20 shown in FIG. 3.

The logical operation of NAND gate 20 and OR gate 10 (shown in FIG. 3) is functionally equivalent as is described in Table 1.

Table 1

| A | $\overline{A}$ | B | $\overline{B}$ | Z | $\overline{A}+\overline{B}$ | $\overline{AB}$ |
|---|---|---|---|---|---|---|
| 0 | 1 | 0 | 1 | 1 | 1 | 1 |
| 1 | 0 | 0 | 1 | 1 | 1 | 1 |
| 0 | 1 | 1 | 0 | 1 | 1 | 1 |
| 1 | 0 | 1 | 0 | 0 | 0 | 0 |

Table 1 illustrates that output Z may be expressed as $$Z = \overline{AB} \quad (2)$$

or, equivalently, as $$Z = \overline{A} + \overline{B} \quad (3)$$

FIG. 4 is a typical prior art ECL circuit representation of NAND gate 20, or OR gate 10. ECL circuit 200 is referred to as a two level ECL circuit, since a first and a second level bias reference signal, VBB1 and VBB2 are implemented. VBB1 is typically equivalent to the voltage level at the midswing of an ECL input signal voltage range such that the logic state of an ECL input signal may be easily determined when compared to VBB1. The voltage level of VBB2 may be expressed as $$VBB2 = VBB1 - Vbe \quad (4)$$

where Vbe is equivalent to one base-to-emitter voltage drop through a transistor, or approximately $-0.8$ V. For example, if the ECL input signal voltage swing is from $-0.75$ V (equivalent to a logical one) to $-1.8$ V (equivalent to a logical zero), VBB1 is typically equivalent to $-1.3$ V, while VBB2 is typically $-2.1$ V. Thus, if the input voltage of ECL input data signal A provided to the base of transistor 209 is a logical one, or $-0.75$ V, which is a voltage greater than VBB1, transistor 209 turns on, or biases to conducting, while transistor 210 turns off. Conversely, if ECL input data signal $\overline{A}$ is a logical zero, or $-1.8$ V, transistor 209 turns off, while transistor 210 switches on.

In the prior art ECL NAND gate 200, an extra transistor 208 is needed in the signal path of ECL input signal B to the base of the differential pair transistors 207/217, referenced to a second level bias reference voltage VBB2. Since VBB2 is approximately $-2.1$ V, or approximately at a voltage at the midswing of an ECL input signal reduced by Vbe, transistor 208 is necessary to reduce ECL input signal B by Vbe to properly reference input signal B to VBB2. Prior art NAND circuit design of FIG. 4 has a drawback of increasing the propagation delay between ECL input signal B to output signal Z due to the extra transistor propagation delay required to reduce input signal B voltage for a second level bias reference, VBB2. As illustrated in FIG. 4, input signal B must first propagate through transistor 208 prior to reaching the base of transistor 207. The propagation delay from input signal B to output signal Z is therefore longer than from input signal A to output signal Z, or $$t_{pd}\ A\ to\ Z < t_{pd}\ B\ to\ Z \quad (5)$$

Input signal B has a longer propagation delay due to input signal B propagating through transistors 208, prior to propagating through the differential pair of transistors 207/217 and transistor 212, while data input signal A need only propagate through differential pair of transistors 209/210 and transistor 212.

FIG. 5 is an example of a typical prior art ECL circuit representation of flip flop 100 implementing one or more of the prior art ECL NAND gate circuit 200. The logical operation of the prior art ECL flip flop 300 circuit is depicted in Table 2. Flip flop 300 receives a data input signal $D_{M-1}$ on input lead 302 and a clock signal on input lead 301 and, in response thereto, provides output signals Q and $\overline{Q}$ on output leads 303 and 304, respectively. ECL flip flop 300 includes master subcircuit 300-M, and slave subcircuit 300-S. Nodes N3 and N4 serve as the output nodes of master subcircuit 300-M, as the input nodes of slave subcircuit 300-S. The master and slave subcircuits each operate in the transparent mode, wherein master and slave input data $D_M$ and $D_S$ immediately appears at the master and slave outputs, respectively, or the latch mode, in which previous input data $D_{M-1}$ and $D_{S-1}$ is latched and provided at the output. When master subcircuit 300-M is in the transparent mode, slave subcircuit 300-S is in the latch mode, and vice versa.

When the clock input signal applied to lead 301 is low, master flip flop 300-M operates in the transparent mode, providing input signal $D_M$ as its intermediate output signal on nodes N3 and N4 which, in turn, provide the data input signal $D_S$ to slave flip flop 300-S. At the same time, slave flip flop 300 operates in the latch mode, providing Q and $\overline{Q}$ output signals indicative of the previous data value $D_{S-1}$ applied to slave flip flop 300-S.

Conversely, when the clock signal applied to input lead 301 is high, master flip flop 300-M operates in the latch mode, and applies a signal $D_S$ to slave flip flop 300-S which is indicative of the previous input data of $D_{M-1}$ applied to master flip flop 300-M. At this time, with a high clock signal, slave flip flop 300-S operates in the transparent mode, providing Q and $\overline{Q}$ output signals indicative of this $D_S$ data provided by master flip flop 300-M.

A current source bias voltage $V_{CS}$ is applied to the base of transistor 372, thereby causing transistor 372 to serve as a current source. Transistor pair 326/333 forms a differential pair responsive to the clock input signal applied to lead 301. The base of transistor 333 is connected to receive a bias voltage VBB2 such that for a high clock input signal applied to lead 301, transistor 326 turns on (and transistor 333 turns off), thereby enabling latch mode differential pair 324/325 and disabling transparent mode differential pair 329/330 of master flip flop 300-M. Conversely, for a low clock input signal on lead 301, transistor 326 turns off (and transistor 333 turns on), thereby enabling transparent mode differential pair 329/330 and disabling latch mode differential pair 324/325 of master flip flop 300-M.

Transistors 329 and 330 form a differential pair of transistors, with the base of transistor 330 receiving bias voltage VBB1 and base 302 of transistor 329 receiving the $D_M$ input signal. With a logical one $D_M$ input signal applied to lead 302, and transistor 333 conducting due to a low clock input signal applied to lead 301, transistor 329 turns on, thus causing transistor 331 to be biased to a low state of conduction, and biasing transistor 332 to a high state of conduction. This establishes suitable voltages at nodes N3 and N4 which are applied to the bases of differential transistor pair 324/325 which latch the $D_M$ input data when transistor 326 turns on in response to a high clock signal subsequently applied to lead 301.

The voltages on nodes N1 and N2 control the conduction states of transistors 332 and 331, and thus the voltages on nodes N3 and N4, respectively. The voltages on nodes N3 and N4 provide the output signal from master subcircuit 300-M which are applied to latch mode differential pair 324/325, and transparent mode differential pair 338/339 of slave subcircuit 300-S. The output signals on nodes N3 and N4 are controlled by the input data $D_M$ when master flip flop 300-M operates in the transparent mode (low clock signal) and by the latched value of the previous data input signal $D_{M-1}$ stored in latch 324/325 when master flip flop 300-M operates in the latch mode (high clock signal).

Slave flip flop 300-S operates in much the same manner as master flip flop 300-M, as indicated in Table 2.

In a master-slave flip flop such as flip flop 300 of FIG. 5, there are two propagation delays which are of primary concern. The set-up time is defined as the time required for the data input signal $D_M$ applied to input lead 302 of master flip flop 300-M to propagate through master flip flop 300-M and to provide on nodes N3 and N4 data input signal $D_S$ to slave flip flop 300-S. As shown in the schematic diagram of FIG. 5, the input data $D_M$ set-up time is equivalent to the propagation delay through transistors: 324/325 and 331/332.

The other propagation delay of importance is referred to as the clock to Q output propagation delay. This is time required for the $D_S$ data to appear as output data in response to a low clock signal. As seen in FIG. 5, the propagation delay associated with the clock to Q output delay is that associated with the following transistors: 320; 340/343; and 346/347. Thus in the prior art ECL flip flop circuit, $$t_{pd} \text{ data to } Q < t_{pd} \text{ clock to } Q \qquad (6)$$

Although the prior art ECL flip flop circuit of FIG. 5 functions properly, the electronics circuits coupled to the ECL flip flop circuits are continuously being improved to operate at a faster and faster speed. To avoid slowing down the operation of the electronic circuits to which the ECL flip flop is coupled, ECL flip flop circuits must also be continuously improved to operate at a faster speed. Accordingly, it remains desirable to provide an ECL flip flop with even greater speeds.

SUMMARY

One objective of this invention is to provide an ECL OR gate, or its logical equivalent, AND gate, whereby the input signals are both referenced to the same bias reference signal such that the propagation delay between each input signal to the output stage is substantially equivalent. The ECL OR (or AND) gate designed in accordance with the teachings of this invention operates faster than ECL OR (or AND) gate using two bias reference signals.

Another objective of this invention is to provide an improved ECL flip flop circuit using the ECL OR (or AND) circuit taught in accordance with the teachings of this invention for a faster ECL flip flop than a ECL flip flop designed using two bias reference signals. In accordance with the teachings of this invention, a flip flop clock input signal is referenced to the same bias reference signal as the flip flop data input signal such that the propagation delay between the clock input to the output stage is substantially the same as the data input to the output stage.

DETAILED DESCRIPTION

Figure 1:
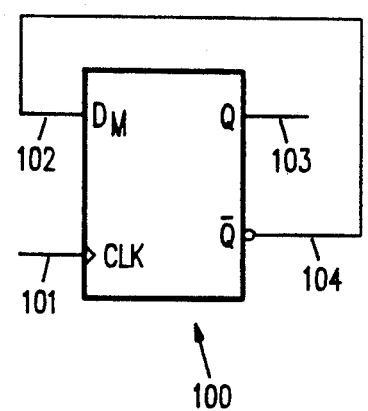
FIG. 1 is a block diagram of a typical prior art D flip flop.
Figure 2:
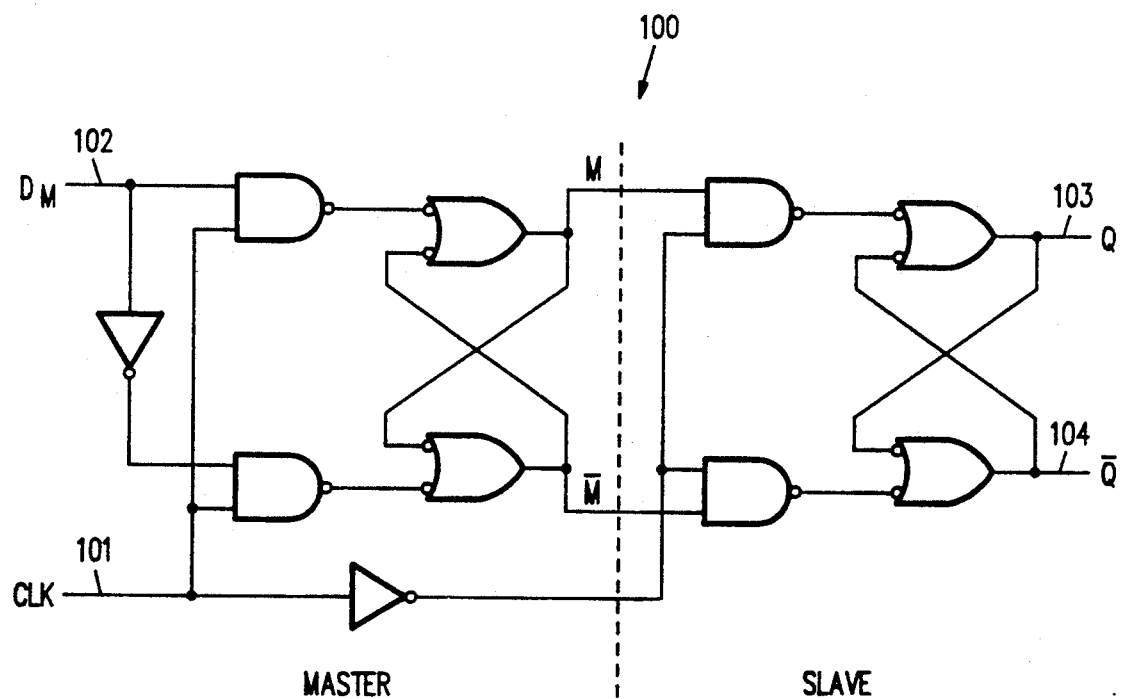
FIG. 2 is a logic diagram of the typical prior art D flip flop of FIG. 1.
Figure 3:
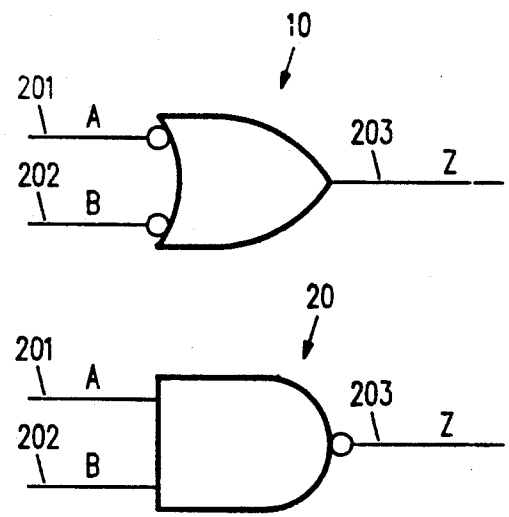
FIG. 3 is a logic diagram of a typical prior art NAND gate and OR gate.
Figure 4:
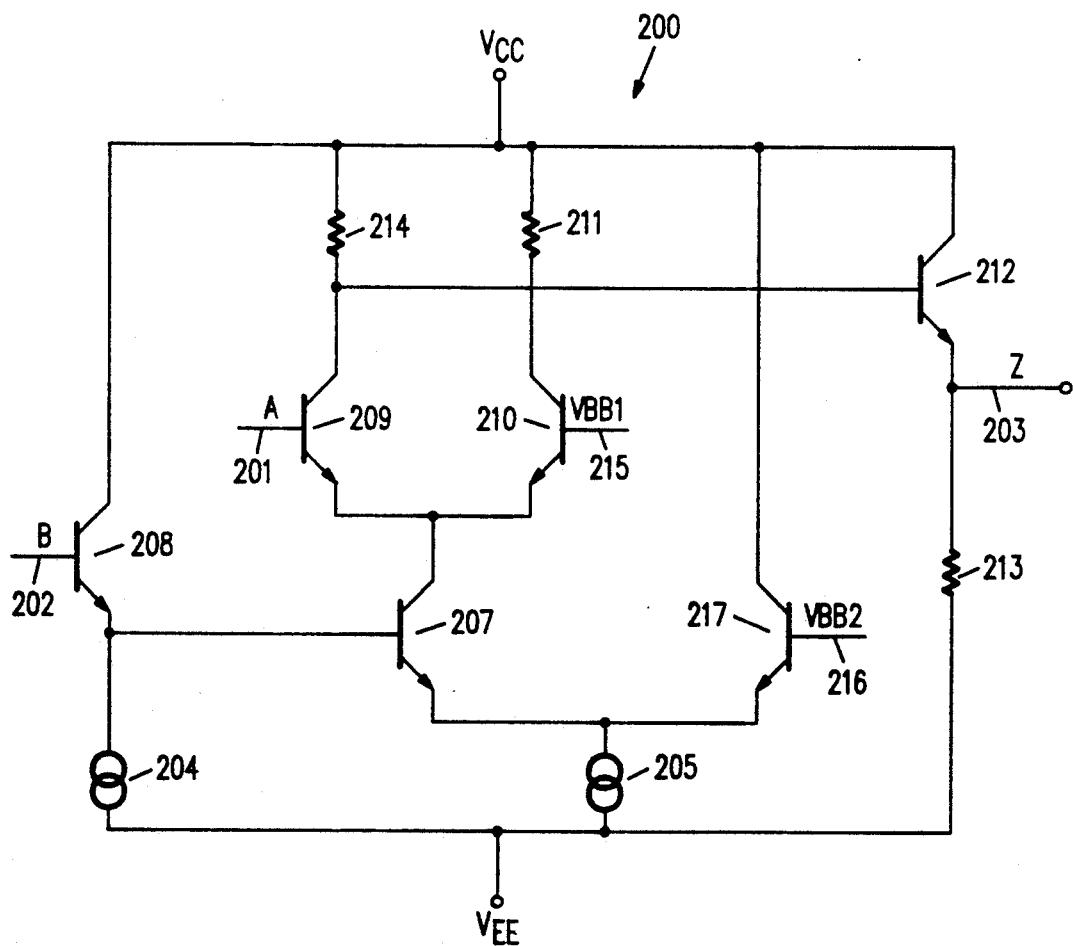
FIG. 4 is a schematic diagram of a typical prior art ECL NAND gate circuit or ECL OR gate circuit.
Figure 5:
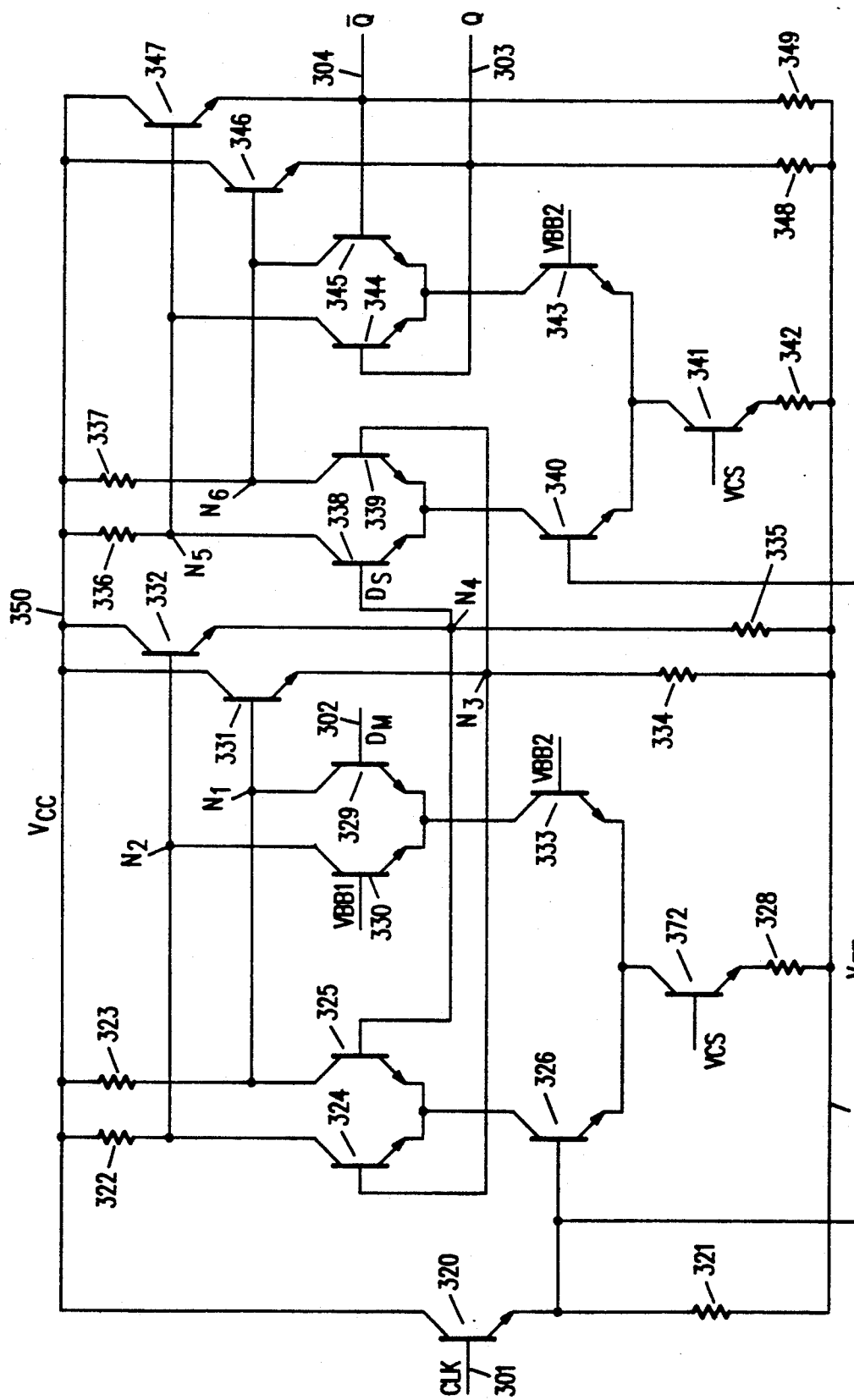
FIG. 5 is a schematic diagram of a typical prior art ECL flip flop circuit.

FIG. 6 is a schematic diagram of an ECL OR gate circuit 270 taught in accordance with the teachings of this invention. A differential pair transistors 533/255 is provided, whereby the base of transistor 253 is a first input port receiving input signal Y, and the base of transistor 255 receives a bias reference signal, VBB1. Transistor 251 is provided whereby the emitter of transistor 251 is electrically connected to the emitters of the differential pair transistors 253/255 and also to a common current source 261. The base of transistor 251 is a second input port receiving input signal X, while the collector of transistor 251 is electrically connected to the collector of transistor 253 and also to a common voltage source, i.e. Vcc. The collector of transistor 255 is electrically connected to one end of a load resistor $R_L$ 258, while the other end of load resistor $R_L$ is electrically connected to common voltage source Vcc. The collector of transistor 255 is also electrically connected to a base 256 of a emitter follower transistor 257. An output W from circuit 270 is electrically connected to an emitter of transistor 257. It is also considered within the scope of the principles taught in this invention to also provide a complementary output $\overline{W}$ such that when inverted input signals are provided at the inputs to circuit 270, circuit 270 operates functionally equivalent to an AND logic gate.

Figure 6A:
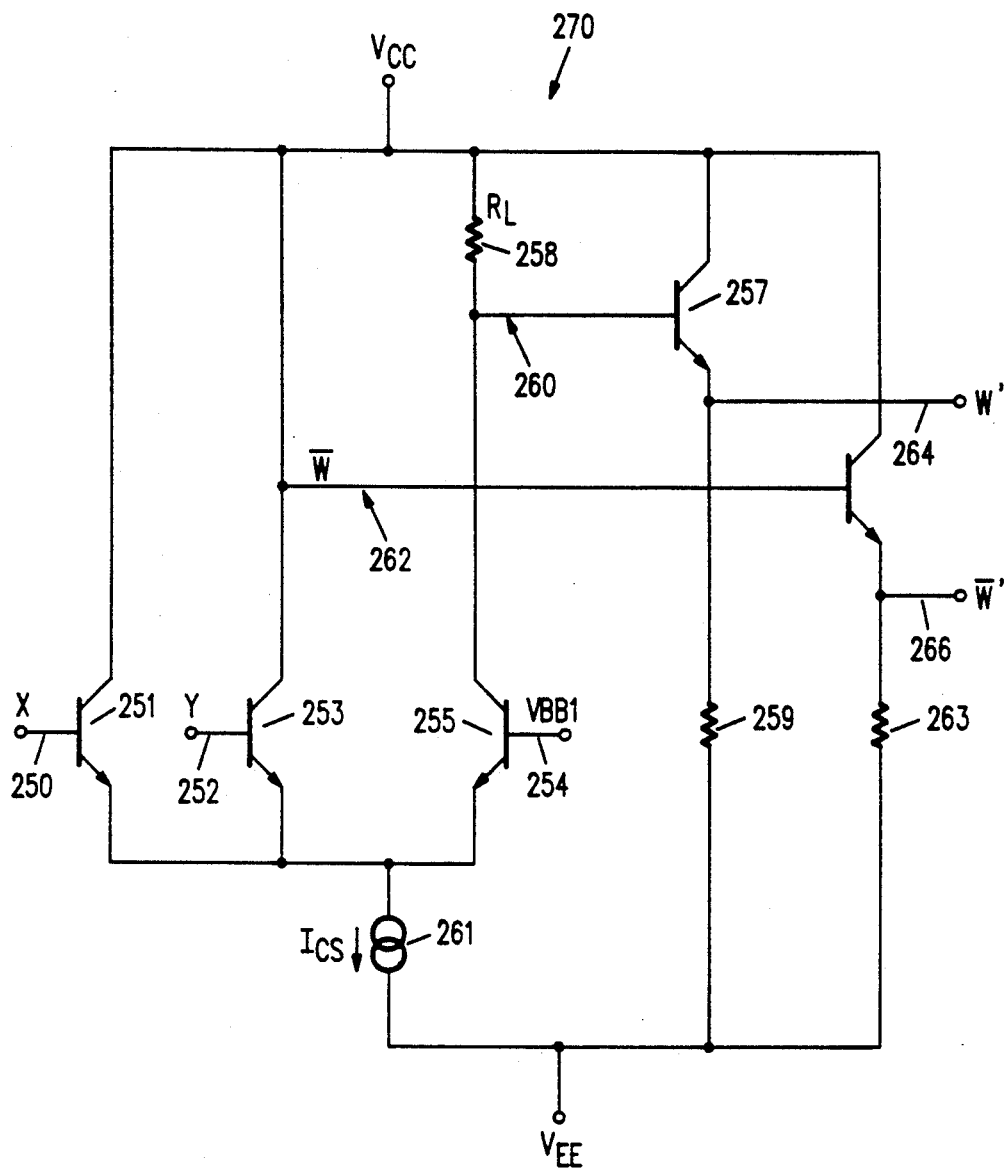
FIGS. 6a and 6b show a schematic diagram of an ECL OR gate circuit, or its logical equivalent, ECL AND gate circuit, constructed in accordance with the teachings of this invention.

Table 3 illustrates the logical operation of circuit 270 as shown in FIG. 6a. Output W is logically equivalent to X OR Y, while complementary output $\overline{W}$ is logically equivalent to $\overline{X}$ AND $\overline{Y}$.

Table 3

| X | $\overline{X}$ | Y | $\overline{Y}$ | W | $\overline{W}$ |
|---|---|---|---|---|---|
| 0 | 1 | 0 | 1 | 0 | 1 |
| 1 | 0 | 0 | 1 | 1 | 0 |
| 0 | 1 | 1 | 0 | 1 | 0 |
| 1 | 0 | 1 | 0 | 1 | 0 |

Figure 6B:
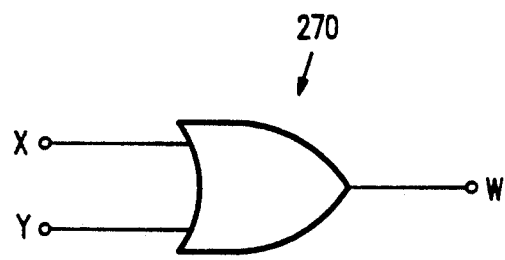

FIG. 6b illustrates an equivalent logic gate to circuit 270. As is illustrated by Table 3, when a logical one, i.e. an input voltage signal of approximately −0.75 V, is provided to either input X or input Y, transistor 255 is off, the base of transistor 257 is substantially equivalent to Vcc, or output W is considered to be equivalent to a logical one. Only when both X and Y input receives a logical zero, i.e. approximately −1.8 V, which is less than VBB1 (i.e. approximately −1.3 V), will transistor 255 switch on to conduct current, and output W is at logical zero. The voltage at base of transistor 257 can be expressed as $$V_{b257} = Vcc - (I_{cs} \times R_L) \quad (7)$$

In accordance with the principles taught by this invention, the propagation delay between input X at the base of transistor 250 to output W at the emitter of transistor 257 is thus substantially equivalent to the propagation delay between input Y at the base of transistor 252 to output W.

Figure 7:
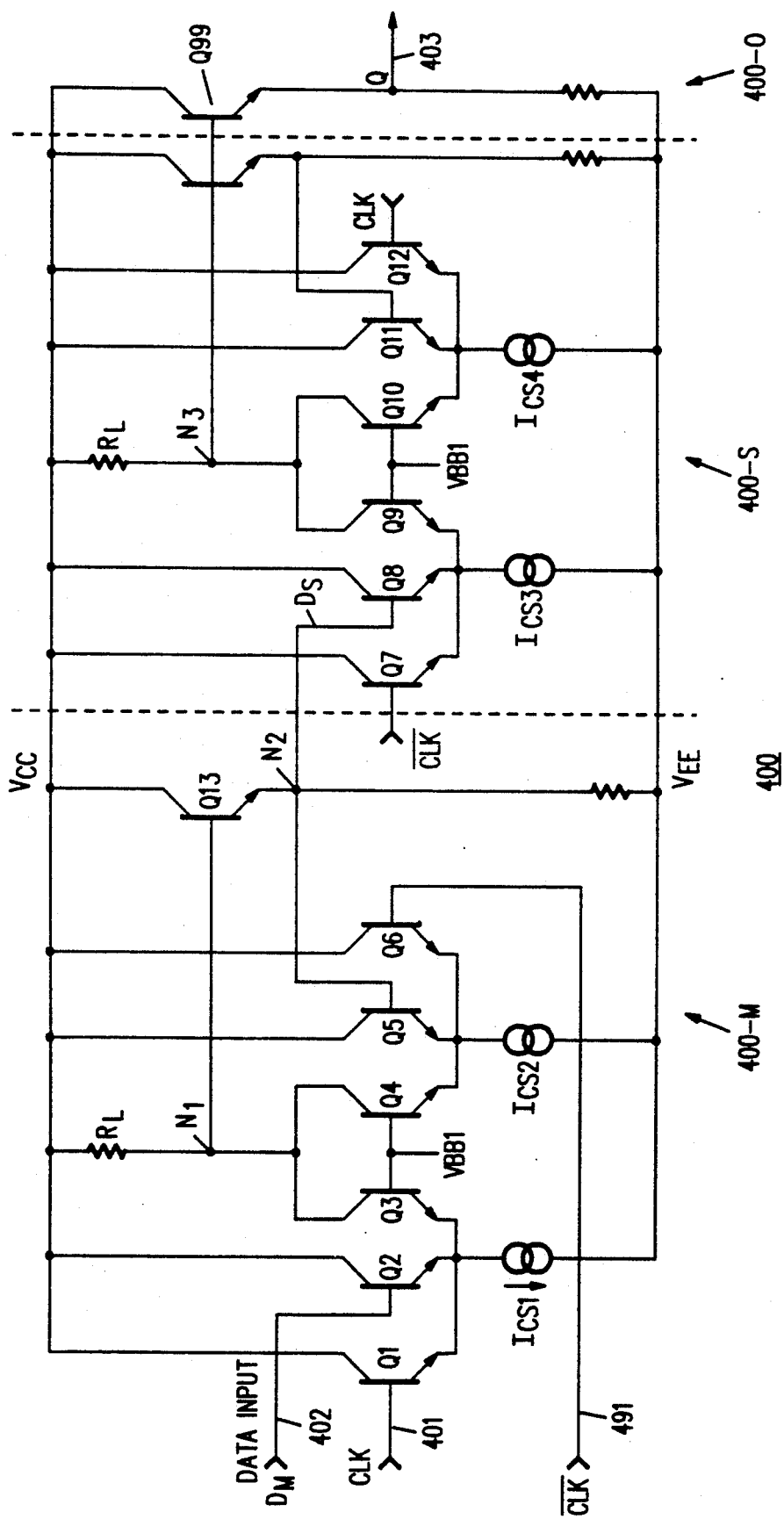
FIG. 7 is a schematic diagram of an ECL flip flop constructed in accordance with the teachings of this invention.

FIG. 7 is a schematic diagram of one embodiment of an ECL D flip flop circuit constructed in accordance with the teachings of this invention implementing ECL OR gate circuit 270 of FIG. 6a. Data input lead 402 and clock input leads 401 and 491 are referenced to the same bias reference voltage VBB1, as is data input, Dm. Thus, for example, the propagation delay from complimentary CLK inputs 401 and 491 to output Q is the same as the propagation delay from data Ds at node $N_2$ to Q output lead 403.

Circuit 400 of FIG. 7 operates in the following manner, as explained with reference to Table 4. When the CLOCK signal applied to lead 401 is high (and thus $\overline{CLOCK}$ is low), mode selection transistor Q1 (and possibly data input transistor Q2, depending on the state of the data input signal $D_M$ applied to data lead 402) will conduct current ICS1. Thus, transistor Q3 will turn off. Since the $\overline{CLOCK}$ signal is low, transistor Q6 turns off, thereby allowing either transistor Q4 or transistor Q5 to turn on, depending on the previous output state ($D_{M-1}$) of transistor Q3. This causes master latch 400-M to operate in the latch mode.

When the CLOCK signal applied to lead 401 is low (and thus $\overline{CLOCK}$ is high), the state of the data signal $D_M$ applied to data input lead 402 dictates whether transistor Q3 will turn on. This causes master latch 400-M to serve as a transparent latch.

The operation of slave latch 400-S operates in a similar manner as master latch 400-M. When the CLOCK signal applied to the base of transistor Q12 is low, and thus the $\overline{CLOCK}$ signal applied to the base of transistor Q7 is high, mode selection transistor Q7 (and possibly data transistor Q8, depending on the state of the data input signal $D_S$ applied to the base of data transistor Q8) conducts current ICS3. Thus, transistor Q9 turns off. Since the CLOCK signal is low, transistor Q12 turns off, thereby allowing either Q10 or Q11 to turn on, depending on the previous output state $D_{S-1}$ of transistor Q99 of output stage 400-0. This causes slave latch 400-S to operate in the latch mode.

Conversely, when the CLOCK signal applied to the base of transistor Q12 is high (and thus $\overline{CLOCK}$ is low) the state of the data signal DS applied to data transistor Q8 dictates whether transistor Q9 will turn on. This causes slave latch 400-S to serve as a transparent latch.

Figure 8:
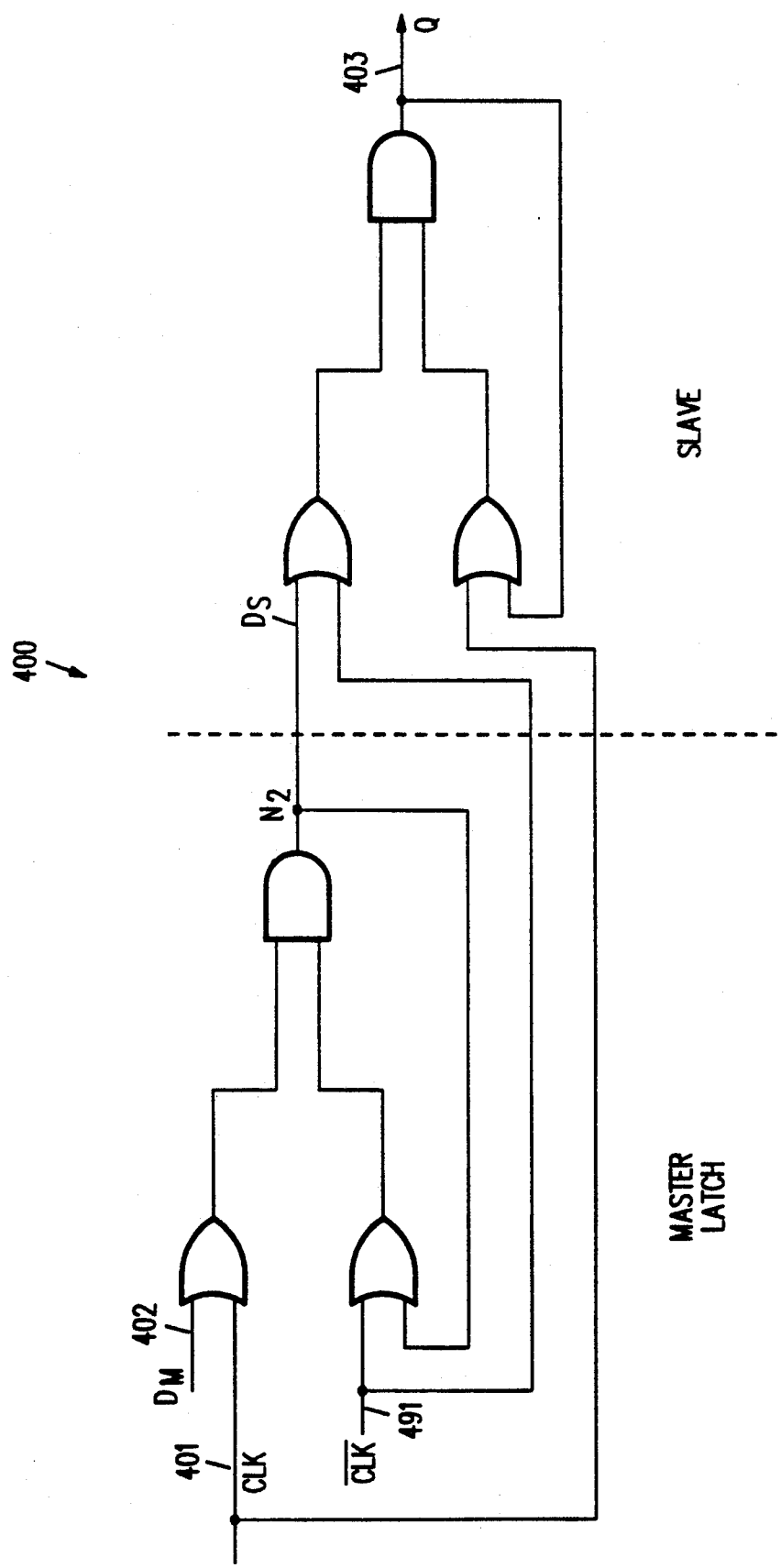
FIG. 8 is a logic diagram of the ECL flip flop shown in FIG. 7.

FIG. 8 is a logic diagram of an ECL D flip flop circuit of FIG. 7 implementing one or more ECL OR gate circuit 270 of FIG. 6a.

In accordance with the teachings of this invention, an improved ECL flip flop is provided which eliminates the provision of a second level bias reference voltage, VBB2, and the extra transistor propagation delay required to reduce the input ECL voltage signals to levels compatible for reference to the second level bias reference voltage signal, VBB2. The elimination of the extra transistor in the path of the input clock signal reduces the propagation delay of input clock signal to the output of the flip flop thus resulting in a faster ECL flip flop.

It is also envisioned as within the teachings of this invention to provide a complementary flip flop output signal at an emitter of an emitter follower, where the base of the emitter follower is coupled to the collectors of Q11 and Q12. Moreover, in an alternative embodiment, another emitter follower may be provided where the base of the emitter follower is also coupled to collector of Q11 and Q12 to provide a complementary flip flop output signal that is isolated from the noise that may result when connected to a feed back portion (slave circuit) of the ECL flip flop.

The invention now being fully described, it will be apparent to one of ordinary skill in the art that many changes and modifications can be made thereto without departing from the spirit or scope of the appended claims.

What is claimed is:
1. An improved ECL flip flop comprising:
   a master circuit, said master circuit comprising:
      a first OR gate, said first OR gate receiving an input data signal and an input clock signal, and providing a first OR gate output signal;
      a second OR gate, said second OR gate receiving a master circuit output signal and an input comple- mentary clock signal and providing a second OR gate output signal; and a master circuit output transistor, said first master circuit output transistor having a base coupled to receive said first OR gate output signal and said second OR gate output signal and providing said master circuit output signal at an emitter of said master circuit output transistor; and a slave circuit, said slave circuit comprising:

a third OR gate, said third OR gate receiving said master circuit output signal and said input complementary clock signal to provide a third OR gate output signal;

a fourth OR gate, said fourth OR gate receiving a flip flop output signal and said input clock signal to provide a fourth output OR gate signal; and a first slave circuit output transistor, said first slave circuit output transistor having a base to receive said third OR gate output signal and said fourth OR gate output signal to provide said flip flop output signal.

2. An improved ECL flip flop circuit of claim 1 wherein said slave circuit further provides a complementary flip flop output signal.

3. An improved ECL flip flop circuit of claim 1 or 2 wherein said slave circuit further provides a second slave circuit output transistor to provide an isolated flip flop output signal.

4. An improved ECL flip flop circuit of claim 1 wherein said slave circuit further provides a second complementary slave circuit output transistor to provide an isolated complementary flip flop output signal.

5. An improved ECL flip flop circuit comprising:

a first OR gate circuit, said first OR gate circuit comprising:

a first transistor and a second transistor, a base of said first transistor receiving an input data signal, a base of said second transistor receiving an input clock signal, and an emitter of said first transistor coupled to an emitter of said second transistor;

a third transistor, a base of said third transistor coupled to a first bias reference signal, and an emitter of said third transistor coupled to said emitter of said first transistor; and a first OR gate output signal port, said first OR gate output signal port coupled to a collector of said third transistor to provide a first OR gate output signal of said first OR gate circuit;

a second OR gate circuit, said second OR gate circuit comprising:

a fourth transistor and a fifth transistor, a base of said fourth transistor coupled to receive a first stage output signal, a base of said fifth transistor receiving a complementary signal of said input clock signal, and an emitter of said fourth transistor coupled to an emitter of said fifth transistor;

a sixth transistor, a base of said sixth transistor coupled to said first bias reference signal, and an emitter of said third transistor coupled to said emitter of said first transistor; and a second OR gate output signal port, said second OR gate output signal port coupled to a collector of said sixth transistor to provide a second OR gate output signal of said second OR gate circuit;

a first stage output port, said first stage output port comprising a seventh transistor, a base of said seventh transistor coupled to said first OR gate output signal port and said second OR gate output signal port to provide said first stage output signal at an emitter of said seventh transistor;

a third OR gate circuit, said third OR gate circuit comprising:

an eigth transistor and a ninth transistor, a base of said eigth transistor receiving said first stage output signal, a base of said ninth transistor receiving said complementary signal of said input clock signal, and an emitter' of said eigth transistor coupled to an emitter of said ninth transistor;

a tenth transistor, a base of said tenth transistor coupled to said first bias reference signal, and an emitter of said tenth transistor coupled to said emitter of said eigth transistor; and a third OR gate output signal port coupled to a collector of said tenth transistor to provide a third OR gate output signal;

a fourth OR gate circuit, said fourth OR gate circuit comprising:

an eleventh transistor and a twelfth transistor, a base of said eleventh transistor coupled to a flip flop output signal, a base of said twelfth transistor receiving said input clock signal, and an emitter of said eleventh transistor coupled to an emitter of said twelfth transistor;

a thirteenth transistor, base of said thirteenth transistor coupled to said first bias reference signal, and an emitted of said thirteenth transistor coupled to said emitter of said eleventh transistor; and a fourth OR gate output signal port, said fourth OR gate output signal port coupled to a collector of said thirteenth transistor to provide a fourth OR gate output signal; and a flip flop output port, said flip flop output port comprising a fourteenth transistor, a base of said fourteenth transistor coupled to said third OR gate output signal port and said fourth OR gate output signal port to provide said flip flop output signal at an emitter of said fourteenth transistor.

6. An improved ECL flip flop of claim 5 wherein said flip flop output port further comprises a fifteenth transistor, a base of said fifteenth transistor coupled to said base of said fourteenth transistor to provide an isolated flip flop output signal at an emitter of said fifteenth transistor.

7. An improved ECL flip flop of claim 5 wherein said flip flop output port further comprises a fifteenth transistor, a base of said fifteenth transistor coupled to said base of said fourteenth transistor to provide an isolated flip flop output signal at an emitter of said fifteenth transistor.

8. An improved ECL flip flop comprising:

a first transistor, said first transistor having a base, an emitter and a collector, said emitter of said first transistor coupled to a first current source, said base of said first transistor coupled to an input clock signal;

a second transistor, said second transistor having a base, an emitter and a collector, said emitter of said second transistor coupled to said emitter of said first transistor, said collector of said second transistor coupled to a first end of a first resistor and said second end of said first resistor coupled to a first voltage source, and said base of said second transistor coupled to a first bias reference signal;

a third transistor, said third transistor having a base, an emitter, and a collector, said emitter of said third transistor coupled to said emitter of said second transistor, said base of said second transistor coupled to an input data signal, and said collector of said third transistor coupled to said collector of said first transistor;

a fourth transistor, said fourth transistor having a base, an emitter, and a collector, said base of said fourth transistor coupled to said first bias reference signal, said emitter of said fourth transistor coupled to a second current source, and said collector of said fourth transistor coupled to said first end of said first resistor and a base of a first emitter follower transistor;

a fifth transistor, said fifth transistor having a base, an emitter, and a collector, said emitter of said fifth transistor coupled to said emitter of said fourth transistor, said base of said fifth transistor coupled to an emitter of said first emitter follower; and a sixth transistor, said sixth transistor having a base, an emitter, and a collector, said emitter of said sixth transistor coupled to said emitter of said fourth transistor, said base of said sixth transistor coupled to a complementary signal of said clock signal, and said collector of said sixth transistor coupled to said collector of said fifth transistor;

a seventh transistor, said seventh transistor having a base, an emitter, and a collector, said emitter of said seventh transistor coupled to a third current source, said base of said seventh transistor coupled to a complementary signal of said input clock signal;

an eighth transistor, said eighth transistor having a base, an emitter, and a collector, said emitter of said eighth transistor coupled to said emitter of said seventh transistor, said base of said eighth transistor coupled to said emitter of said first emitter follower, said collector of said eighth transistor coupled to said collector of said seventh transistor;

a ninth transistor, said ninth transistor having a base, an emitter, and a collector, said emitter of said ninth transistor coupled to said emitter of said eighth transistor, said base of said ninth transistor coupled to said first bias reference signal, said collector of said ninth transistor coupled to a first end of a second resistor and said second end of said second resistor coupled to said first voltage source;

a tenth transistor, said tenth transistor having a base, an emitter, and a collector, said emitter of said tenth transistor coupled to a fourth current source, said base of said tenth transistor coupled to said first bias reference signal, said collector of said tenth transistor coupled to said collector of said ninth transistor and a base of a second emitter follower transistor;

an eleventh transistor, said eleventh transistor having a base, an emitter, and a collector, said emitter of said eleventh transistor coupled to said emitter of said tenth transistor, said base of said eleventh transistor coupled to an emitter of said second emitter follower transistor; and a twelfth transistor, said twelfth transistor having a base, an emitter, and a collector, said emitter of said twelfth transistor coupled to said emitter of said tenth transistor, said collector of said twelfth transistor coupled to said collector of said eleventh transistor, sad base of said twelfth transistor coupled to said input clock signal; and an output signal port coupled to said emitter of said second emitter follower, wherein if said complementary clock signal is asserted a value represented by said input data signal is latched at said emitter of said first emitter follower and said value is provided at said output signal port of said second emitter follower.

* * * * *